United States Patent [19]
Gillette

[11] Patent Number: 6,011,403
[45] Date of Patent: Jan. 4, 2000

[54] CIRCUIT ARRANGEMENT FOR MEASURING LEAKAGE CURRENT UTILIZING A DIFFERENTIAL INTEGRATING CAPACITOR

[75] Inventor: Garry C. Gillette, San Jose, Calif.

[73] Assignee: Credence Systems Corporation, Fremont, Calif.

[21] Appl. No.: 08/961,645

[22] Filed: Oct. 31, 1997

[51] Int. Cl.[7] .............................. G01R 31/26; G01R 13/00
[52] U.S. Cl. .............................................. 324/763; 324/765
[58] Field of Search ................................ 324/73.1, 158.1,
324/763, 765, 537, 538; 714/736, 733,
734, 724; 702/57, 58, 85

[56] References Cited

U.S. PATENT DOCUMENTS

| | | | |
|---|---|---|---|
| 4,092,589 | 5/1978 | Chau et al. .............................. | 714/736 |
| 5,200,696 | 4/1993 | Menis et al. ............................. | 324/73.1 |
| 5,543,728 | 8/1996 | Grace et al. ............................. | 324/763 |

*Primary Examiner*—Vinh P. Nguyen
*Attorney, Agent, or Firm*—Smith-Hill and Bedell

[57] ABSTRACT

A circuit arrangement for use in a semiconductor integrated circuit tester for measuring leakage current supplied from a pin of a semiconductor integrated circuit device under test (DUT) to a programmed voltage level includes a voltage source having an output terminal, a feedback mechanism connected between the DUT pin and the voltage source for controlling the voltage source to force the DUT pin to the programmed voltage level, a capacitor connected between the output terminal of the voltage source and the DUT pin, and a circuit for measuring voltage developed across the capacitor.

5 Claims, 3 Drawing Sheets

CIRCUIT ARRANGEMENT FOR MEASURING LEAKAGE CURRENT UTILIZING A DIFFERENTIAL INTEGRATING CAPACITOR

BACKGROUND OF THE INVENTION

This invention relates to a circuit arrangement for measuring leakage current, particularly in a semiconductor integrated circuit tester.

It is necessary to be able to measure low currents in the parametric testing of a semiconductor integrated circuit device. For example, the input leakage test on a pin of a device under test (DUT) fabricated with CMOS technology may be less than 100 pA. In order to measure the input leakage current, all sources of parasitic leakage are disconnected from the pin and the specified voltage at which the current is to be measured is forced on the pin and the resulting current flow is measured using a parametric measurement unit (PMU). Currently the input voltages may be in the range from −2 volts to +15 volts. The current flow can be monitored by observing the voltage drop in a series pass impedance, such as a resistor or a capacitor. When the series pass impedance is a capacitor, the voltage drop across the capacitor represents the integral of the current flow through the capacitor. By adjusting the integration interval to be a fixed and precise duration, the sensitivity of the voltage drop to current flow is constant. This is expressed by the relation:

$$E_{cap} = (I * \Delta T)/C$$

where C is the capacitor value, I is the current to be measured and $\Delta T$ is the duration of the integration interval. Prior to the beginning of the integration interval, the voltage $E_{cap}$ across the capacitor is typically reduced to zero by closing a FET switch. At the beginning of the integration interval, the FET switch is opened. The voltage is measured at the end of the integration interval. A FET switch is employed because mechanical relays are too slow to allow short integration intervals and short intervals between integrations.

SUMMARY OF THE INVENTION

In accordance with the invention there is provided a circuit arrangement for use in a semiconductor integrated circuit tester for measuring leakage current supplied from a pin of a semiconductor integrated circuit device under test (DUT) to a programmed voltage level, comprising a voltage source having an output terminal, a feedback means connected between the DUT pin and the voltage source for controlling the voltage source to force the DUT pin to said programmed voltage level, a capacitor connected between the output terminal of the voltage source and the DUT pin, and a means for measuring voltage developed across the capacitor.

BRIEF DESCRIPTION OF THE DRAWINGS

For a better understanding of the invention, and to show how the same may be carried into effect, reference will now be made, by way of example, to the accompanying drawings, in which.

In the following description, the reference EX or $E_X$, where X is a letter or number, designates not only a circuit element but also the voltage associated with that circuit element.

DETAILED DESCRIPTION

Figure 1:
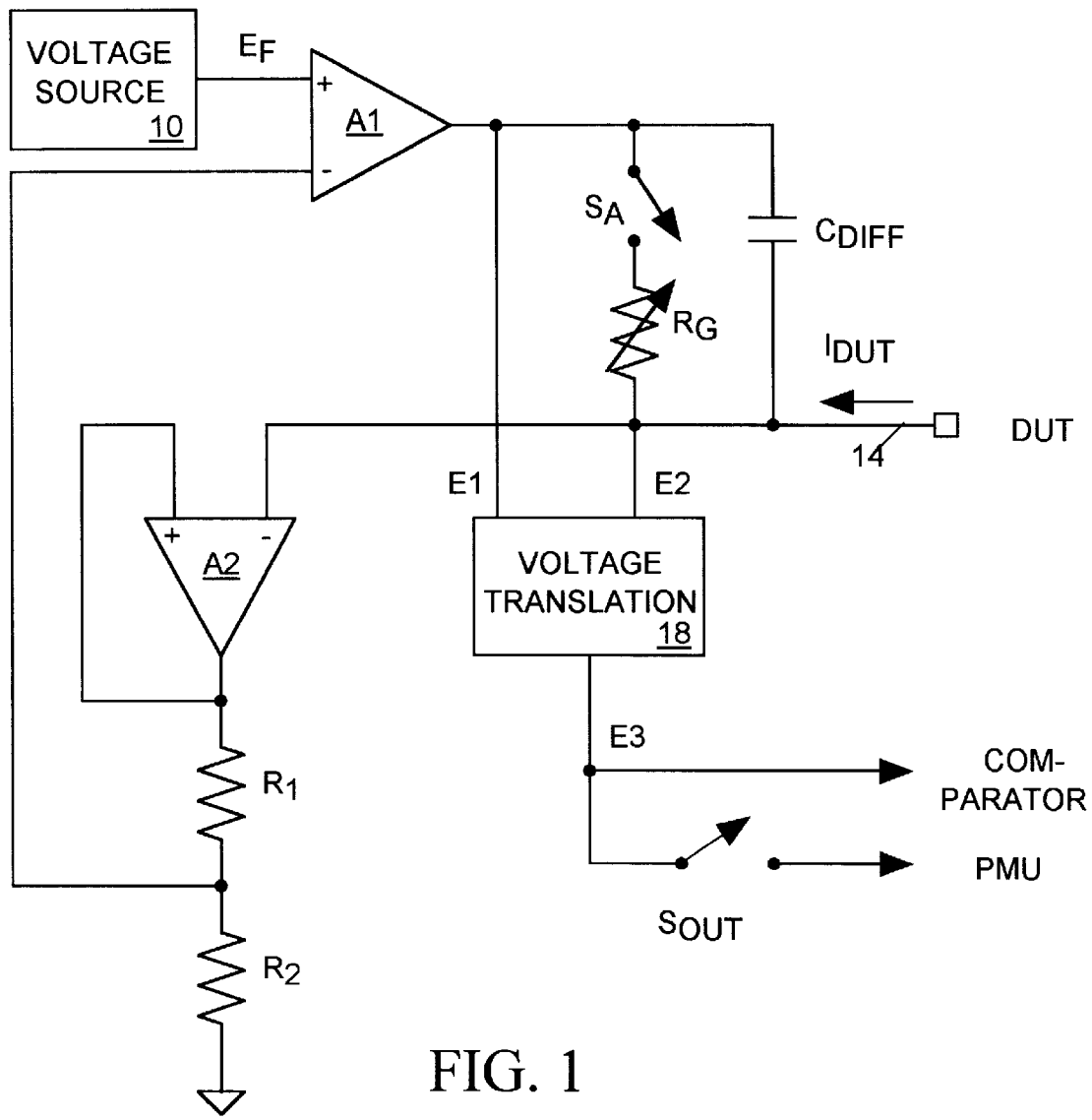
FIG. 1 is a schematic diagram of a current measurement circuit employing a capacitor as series pass impedance.

FIG. 1 illustrates part of a pin electronics circuit used in a semiconductor integrated circuit tester. The pin electronics circuit serves as a channel of the tester and several such pin electronics circuits are provided on a single pin card. Some resources of the tester, in particular a system PMU, which typically includes an analog-to-digital converter, are shared among all the channels of the tester whereas other resources, such as dual voltage comparators for testing high and low limit values, are provided on a per card basis and are shared among the channels on a single pin card.

The pin electronics circuit shown in FIG. 1 includes a programmable voltage source 10, such as a digital-to-analog converter, having an output $E_F$ connected to the non-inverting input of an op-amp A1 whose output is connected through a switch $S_A$ and a variable resistor $R_G$ to a pin 14 of a semiconductor integrated circuit device under test (DUT).

The pin 14 is also connected to the non-inverting input of a unity-gain op-amp A2 whose output is connected through a voltage divider composed of two resistors R1 and R2 to ground. The tap of the voltage divider is connected to the inverting input of the amplifier A1. With negligible input current, the op-amp A2 provides a high impedance Kelvin type feedback connection from the DUT pin 14 to the amplifier A1. The resistors R1 and R2 are preferably of equal value, and consequently the action of the op-amps A1 and A2 forces the pin 14 to the voltage $2*E_F$.

FIG. 1 also illustrates a differential integration capacitor $C_{DIFF}$, which is connected in parallel with the serial combination of the switch $S_A$ and the variable resistor $R_G$, and a voltage translation circuit 18 having input terminals E1 and E2 connected across the capacitor $C_{DIFF}$ and an output terminal E3. The output voltage E3 of the voltage translation circuit is equal to (E1−E2). The output terminal E3 is connected to the dual voltage level comparators, for comparing the voltage E3 with selected high and low voltage levels for pass-fail testing, and it can also be connected through a switch $S_{OUT}$ to the system PMU for more precise measurement.

Initially, the switch $S_A$ is closed. The DUT flows a constant leakage current $I_{DUT}$ at the pin 14. In the initial condition, the leakage current is supplied through the switch $S_A$.

The switch $S_A$ is opened at time t=t0. The amplifier A1 creates a current summing node at the terminal E2. Since the terminal E2 remains at the voltage $2*E_F$ and the amplifier A2 has negligible input current, the capacitor $C_{DIFF}$ supplies the leakage current $I_{DUT}$ to the DUT pin 14. Since the leakage current $I_{DUT}$ is constant, the voltage E1−E2 increases linearly with time in accordance with the relationship:

$$(E1-E2) = I_{DUT} * (t-t0)/C_{DIFF}$$

Since (E1−E2) is equal to E3, the leakage current $I_{DUT}$ is equal to $E3 * C_{DIFF}/(t-t0)$. At time t=t1 the voltage E3 is sampled, either by strobing an analog-to-digital converter at the input of the PMU or by strobing the dual comparators.

The PMU provides a measured value of the leakage current $I_{DUT}$ whereas the dual comparators indicate whether the leakage current is within an acceptable range. After the voltage E3 has been sampled, the switch $S_A$ is closed and the capacitor $C_{DIFF}$ is discharged.

The voltage difference (E1–E2) is normally in the range +/–1 volt in the mode of operation described above. Since this voltage is in series with the output voltage of the amplifier A1, it does not affect the voltage at the DUT pin 14.

Assuming that the value of $C_{DIFF}$ is 100 pf, the maximum value of E3 is 1 volt (positive or negative) and E3 can be measured with an accuracy of 1 mv, the range of the current measurement technique described above is as follows:

| (t1 – t0) | $I_{DUT}$ (full scale) | $I_{DUT}$ (resolution) |
|---|---|---|
| 10 ms | 10 nA | 0 pA |
| 1 ms | 100 nA | 100 pA |
| 100 us | 1 uA | 1 nA |
| 10 us | 10 uA | 10 nA |

The voltage translation circuit 18 shown in FIG. 1 may be implemented using a differential amplifier. However, it is important to ensure that the output voltage of the amplifier is independent of the common mode voltage at the inputs of the amplifier. Moreover, for precise measurements, it is necessary to ensure that the output voltage of the differential amplifier is independent of the input offset voltage of the amplifier.

The design of a suitable differential amplifier based on CMOS technology is not straightforward because of process related factors that affect the operation of CMOS circuits. Specifically, zero offset voltages of CMOS differential amplifiers are large and unpredictable, depend on common mode input voltage and may vary with time. It is desirable to use low capacitance CMOS technology because the circuit capacitance loads the high speed functions on the pin. However, the maximum power supply voltages that can be employed with most low capacitance CMOS technologies are such that the common mode input voltage of an active differential amplifier must be less than +15 volts.

Figure 2A:
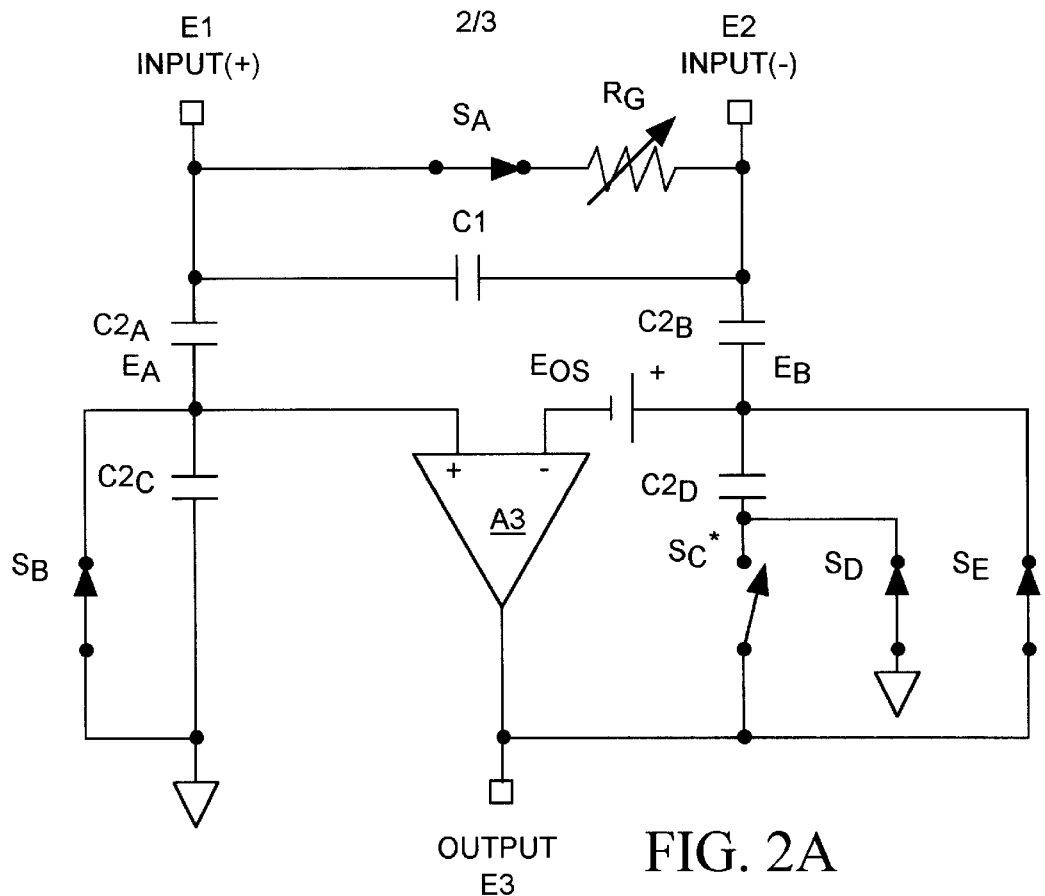
FIG. 2A is a schematic diagram of a differential amplifier circuit used in the current measurement circuit of FIG. 1 in a first operating state.
Figure 2B:
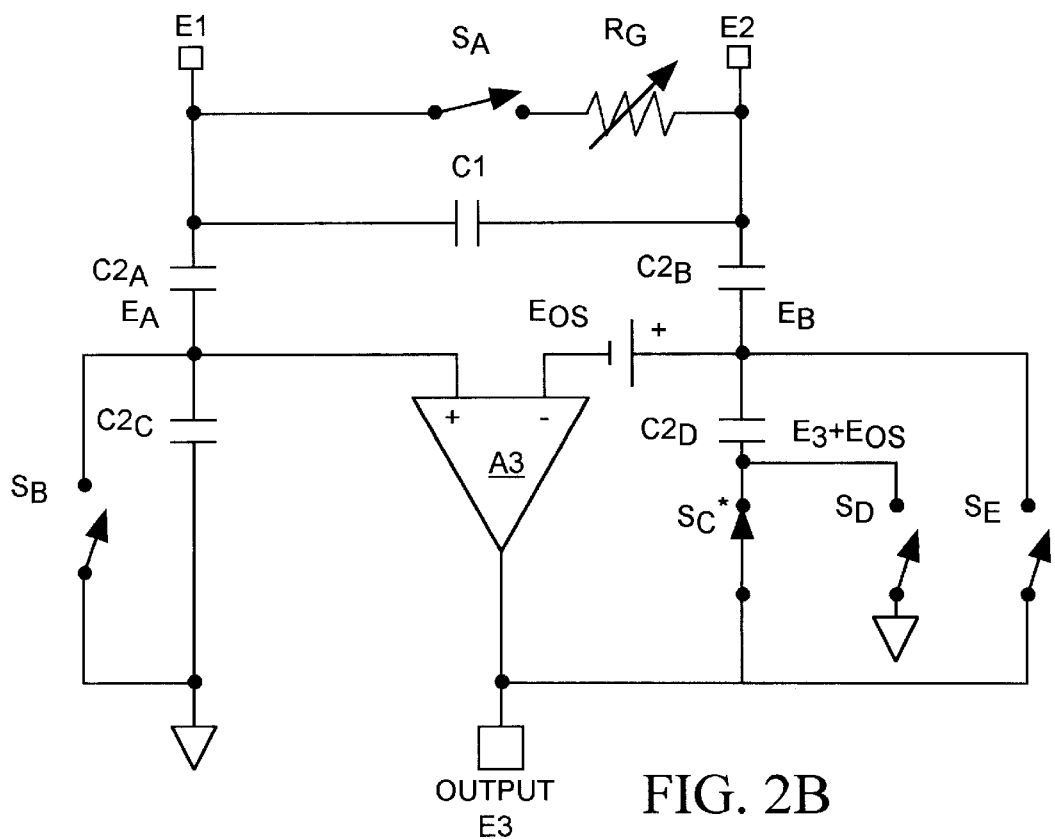
FIG. 2B is a schematic diagram of the differential amplifier circuit in a second operating state.

In a practical implementation of the arrangement shown in FIG. 1, the voltage translation circuit 18 is implemented using the circuit shown in FIGS. 2A and 2B.

FIG. 2A shows the differential input terminals E1 and E2 connected through capacitors $C2_A$ and $C2_B$ to nodes $E_A$ and $E_B$ respectively. A capacitor C1 is connected in parallel with the switch $S_A$. The node $E_A$ is connected to the non-inverting input of a CMOS differential amplifier A3. A capacitor $C2_C$, which is shunted by a switch $S_B$, is connected between the node $E_A$ and ground. One terminal of a capacitor $C2_D$ is connected to the node $E_B$ and the other terminal of the capacitor $C2_D$ is connected both through a switch $S_C$ to the output E3 of the amplifier A3 and through a switch $S_D$ to ground. A switch $S_E$ is connected in parallel with the capacitor $C2_D$ and the switch $S_C$.

The voltage source $E_{OS}$ illustrated in FIG. 2A represents the input offset voltage of the amplifier A3, which is the difference in input voltages necessary to bring the output voltage to zero. Thus, if $E_B$ is equal to $E_A + E_{OS}$, the output voltage E3 is zero, and accordingly the amplifier A3 attempts to force the node $E_B$ to the voltage $E_A + E_{OS}$.

The common mode rejection of the amplifier A3 is limited by how closely the capacitors C2 are matched in capacitance. Using current technology, the capacitors C2 can be matched sufficiently closely that the common mode rejection ratio can be as high as 1000, independently of the capacitance value of the capacitors C2. Nevertheless, since the common mode voltage can be as high as 15 volts, the error in output voltage can be 15 mv, or as much as 1.5% of full scale.

In the configuration shown in FIG. 2A, which corresponds to the initial condition of the circuit shown in FIG. 1, the switches $S_A$, $S_B$, $S_D$ and $S_E$ are closed and the switch $S_C$ is open. Since $E_A$ is zero volts and the node $E_B$ is at the voltage E3, the amplifier A3 forces the node $E_B$ to the voltage $+E_{OS}$ by generating the voltage E3 at the level $+E_{OS}$. In this state, there will be a voltage $E_{OS}$ across the capacitor $C2_D$. When the switches change state to the configuration shown in FIG. 2B, the voltage $E_B$ is no longer forced to be equal to the output voltage E3. On the contrary, the voltage $E_B$ is equal to $E3+E_{OS}$. The voltage $E_{OS}$ that was previously applied across the capacitor $C2_D$ cancels the effect of the input offset voltage on the output voltage E3, providing an auto-zero cancellation of the input offset voltage of the amplifier A3 while at the common mode force voltage, creating a zero point that is independent of the force voltage. As long as input error currents from the amplifier A3 are negligibly low, any voltage applied across the input terminals E1 and E2 is reproduced at the output terminal E3 and referenced to ground with a gain of exactly one. The output voltage E3 is independent of the common mode voltage (E1+E2)/2. When all C2 have the same value, this operation is expressed by the following relationships:

$E_A = E1/2$ $E_B = E_A$ $E3 = 2E_B - E2$ $E3 = 2E_A - E2 = E1 - E2$

Since this manner of operation requires only that the capacitors C2 be equal and is independent of the capacitance values of the capacitors C2, production yield is favorably affected.

The circuit arrangement shown in FIGS. 2A and 2B enables auto-zero correction of amplifier input voltage offset. The zero value output is referenced to ground, by virtue of the switch $S_B$ being closed during the reset phase, without DC current flow.

In the arrangement shown in FIGS. 2A and 2B, the differential integration capacitance $C_{DIFF}$ presented across the inputs E1 and E2 is the sum of C1 and C2/2. If C2 is 50 pf and C1 is 75 pf, the differential integration capacitance is 100 pf.

Although the range of voltages applied to the DUT pin 14 is from –2 V to +15 V, the common mode voltage applied to the amplifier A3 is essentially zero volts due to the auto-zero reset phase. Since the inputs to the amplifier A3 are reset to zero volts, the power supply voltages can be reduced and this allows the use of standard low voltage CMOS technology for fabrication of the active amplifier A3.

Figure 3:
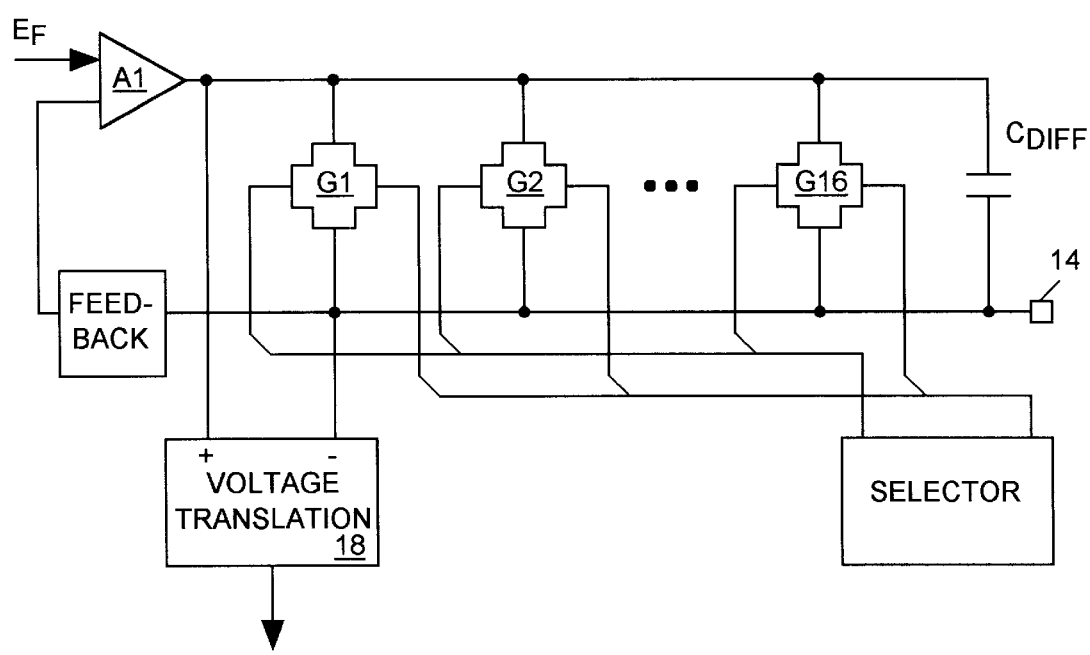
FIG. 3 is a schematic diagram of the current measurement circuit configured to employ a resistor as series pass impedance.

In a preferred embodiment of the invention, the switch $S_A$ is implemented by a parallel array of CMOS transmission gates G1. . . G16, equivalent to a variable resistor in series with a switch, as shown in FIG. 3. The programming of the transmission gates may be accomplished in the manner described in co-pending Pat. Application No. 08/962,051 filed Oct. 31, 1997, now U.S. Pat. No. 5,955,890. The resistance value $R_G$ of the transmission gates can typically be varied over the range 50 to 10,000 ohms, depending on the pattern in which the gates are enabled, and is selected so that it is sufficiently low that its time constant with the differential capacitance $C_{DIFF}$ is negligible.

As indicated above, the current measurement technique employing measurement of the voltage across the capacitor $C_{DIFF}$ at a selected time provides a full scale measurement range from 10 nA to 10 uA. It may however be desirable to measure substantially larger currents, e.g. up to 20 mA. This may be accomplished by operating in a mode in which the current is sensed by measuring voltage drop across a resistor. Thus, when at least one of the CMOS transmission gates is enabled, the voltage drop between the terminals E1 and E2 is equal to $I_{DUT}*R_G$. This voltage is translated to the output terminal E3 where it is used for zero voltage based comparing and measuring. In this mode of operation, the value of $R_G$ is adjusted to achieve the desired full scale voltage drop associated with the full scale current. For example, if the full scale current is 20 mA, a resistance $R_G$ of 50 ohms is provides a voltage drop of 1 volt and if the full scale current is 100 uA a resistance $R_G$ of 10,000 ohms provides a voltage drop of 1 volt.

Subject matter disclosed in this application is related to subject matter disclosed and claimed in one or more of Pat. Application Ser. No. 08/962,051 filed Oct. 31, 1997 and Pat. Application Ser. No. 08/962,050 filed Oct. 31, 1997, the entire disclosure of each of which is hereby incorporated by reference herein. Each of these copending applications discloses a measurement circuit in which one of the circuit elements is an array of CMOS transmission gates. By use of suitable switching, the same array of transmission gates can be used to implement each of the circuits.

It will be appreciated that the invention is not restricted to the particular embodiment that has been described and shown, and that variations may be made therein without departing from the scope of the invention as defined in the appended claims and equivalents thereof.

I claim:

1. A circuit arrangement for use in a semiconductor integrated circuit tester for measuring leakage current supplied from a pin of a semiconductor integrated circuit device under test (DUT) to a programmed voltage level, comprising:

a voltage force means having an output terminal, a feedback means connected between the DUT pin and the voltage force means for controlling the voltage force means to force the DUT pin to said programmed voltage level, a differential integrating capacitor connected between the output terminal of the voltage force means and the DUT pin, and a means for measuring voltage developed across the capacitor.

2. A circuit arrangement according to claim 1, comprising a switch means connected in parallel with the capacitor for periodically discharging the differential integrating capacitor.

3. A circuit arrangement according to claim 2, wherein the switch means comprises a plurality of CMOS transmission gates and selection means for selecting the state of each transmission gate.

4. A circuit arrangement according to claim 1, wherein the voltage measuring means comprises a differential amplifier having first and second input terminals and an output terminal and an auto-zero means for auto-zeroing input offset voltage of the differential amplifier.

5. A circuit arrangement according to claim 4, wherein said auto-zero means comprises a first switch connected in parallel with the differential integrating capacitor, a second switch connected between the first input terminal of the amplifier and a reference potential level, a third switch connected between the second input terminal of the amplifier and the output terminal thereof, a second capacitor connected between a circuit node and the second input terminal of the amplifier, a fourth switch connected between said circuit node and the output terminal of the amplifier, and a fifth switch connected between said circuit node and the reference potential level.

* * * * *